United States Patent
Kwon

(10) Patent No.: US 10,566,535 B2
(45) Date of Patent: *Feb. 18, 2020

(54) METHOD OF MANUFACTURING SUBSTRATE OF ORGANIC LIGHT-EMITTING DISPLAY DEVICE

(71) Applicant: Samsung Display Co., Ltd., Yongin (KR)

(72) Inventor: Young Gil Kwon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/202,098

(22) Filed: Nov. 28, 2018

(65) Prior Publication Data

US 2019/0148643 A1 May 16, 2019

Related U.S. Application Data

(60) Continuation of application No. 15/859,702, filed on Jan. 1, 2018, now Pat. No. 10,147,881, which is a
(Continued)

(30) Foreign Application Priority Data

Oct. 20, 2014 (KR) ........................ 10-2014-0141764

(51) Int. Cl.
*H01L 51/00* (2006.01)
*H01L 27/32* (2006.01)
(Continued)

(52) U.S. Cl.
CPC ........ *H01L 51/0016* (2013.01); *G03F 7/0045* (2013.01); *G03F 7/0046* (2013.01);
(Continued)

(58) Field of Classification Search
CPC . H01L 51/56; H01L 51/0013; H01L 27/3246; H01L 27/3283; H01L 27/3211;
(Continued)

(56) References Cited

U.S. PATENT DOCUMENTS

| 8,093,612 | B2 * | 1/2012 | Tanaka | ................ H01L 51/0013 257/40 |
| 8,153,201 | B2 * | 4/2012 | Aoyama | ............. H01L 51/0013 427/407.1 |

(Continued)

FOREIGN PATENT DOCUMENTS

| KR | 10-2005-0082953 | 8/2005 |
| KR | 10-2006-0089838 | 8/2006 |

(Continued)

OTHER PUBLICATIONS

Alexander A. Zakhidov et al., Orthogonal processing: A new strategy for organic electronics, Chemical Science, 2011, vol. 2, 1178-1182 (2011).

(Continued)

*Primary Examiner* — Jaehwan Oh
(74) *Attorney, Agent, or Firm* — H.C. Park & Associates, PLC

(57) ABSTRACT

A method of forming an organic material pattern film, the method including: forming partition walls on a first region of a first layer, the partition walls including a fluorine containing material; forming a second layer including an organic material on a second region of the first layer, the second region being defined by the partition walls; and removing the partition walls.

7 Claims, 22 Drawing Sheets

Related U.S. Application Data continuation of application No. 15/583,650, filed on May 1, 2017, now Pat. No. 9,893,284, which is a continuation of application No. 15/082,726, filed on Mar. 28, 2016, now Pat. No. 9,673,396, which is a division of application No. 14/668,351, filed on Mar. 25, 2015, now Pat. No. 9,577,195.

(51) Int. Cl.
| | | |
|---|---|---|
| *H01L 51/56* | (2006.01) | |
| *G03F 7/004* | (2006.01) | |
| *G03F 7/16* | (2006.01) | |
| *G03F 7/20* | (2006.01) | |
| *G03F 7/26* | (2006.01) | |
| *H01L 51/50* | (2006.01) | |

(52) U.S. Cl.
CPC .............. *G03F 7/16* (2013.01); *G03F 7/2002* (2013.01); *G03F 7/26* (2013.01); *H01L 27/3246* (2013.01); *H01L 27/3283* (2013.01); *H01L 51/0013* (2013.01); *H01L 51/56* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2227/323* (2013.01)

(58) Field of Classification Search
CPC ......... H01L 51/0004; H01L 2251/5338; H01L 51/003
See application file for complete search history.

(56) References Cited

U.S. PATENT DOCUMENTS

| | | | | |
|---|---|---|---|---|
| 9,217,926 | B2* | 12/2015 | Ferro | G03F 7/2022 |
| 2006/0043881 | A1* | 3/2006 | Chin | H01L 51/0013 |
| | | | | 313/503 |
| 2008/0233827 | A1* | 9/2008 | Kagami | H01L 51/0013 |
| | | | | 445/24 |
| 2009/0104835 | A1* | 4/2009 | Aoyama | H01L 51/0013 |
| | | | | 445/58 |
| 2009/0117403 | A1* | 5/2009 | Sutcliffe | B22F 3/1055 |
| | | | | 428/650 |
| 2010/0035166 | A1* | 2/2010 | Ishizeki | G03F 7/0007 |
| | | | | 430/7 |
| 2010/0289019 | A1* | 11/2010 | Katz | G03F 7/0035 |
| | | | | 257/40 |
| 2011/0129779 | A1* | 6/2011 | Lee | B41M 5/38214 |
| | | | | 430/312 |
| 2011/0143282 | A1* | 6/2011 | Takahashi | G02B 5/201 |
| | | | | 430/287.1 |
| 2011/0159252 | A1* | 6/2011 | Ober | G03F 7/0046 |
| | | | | 428/195.1 |
| 2013/0266778 | A1* | 10/2013 | Ishizeki | G02B 5/201 |
| | | | | 428/195.1 |
| 2013/0337649 | A1* | 12/2013 | Tachibana | G03F 7/094 |
| | | | | 438/694 |
| 2014/0057379 | A1* | 2/2014 | Park | G03F 7/094 |
| | | | | 438/46 |
| 2014/0335445 | A1* | 11/2014 | Kang | G03F 1/68 |
| | | | | 430/5 |
| 2015/0092136 | A1* | 4/2015 | Kim | G02F 1/136227 |
| | | | | 349/46 |
| 2015/0140729 | A1* | 5/2015 | Ferro | G03F 7/2022 |
| | | | | 438/99 |
| 2015/0188063 | A1* | 7/2015 | Takeya | H01L 51/0554 |
| | | | | 257/40 |
| 2015/0219992 | A1* | 8/2015 | Matsuura | C08F 290/06 |
| | | | | 430/11 |
| 2016/0035561 | A1* | 2/2016 | Aibara | H01L 21/67028 |
| | | | | 134/4 |
| 2016/0035564 | A1* | 2/2016 | Aibara | H01L 21/02057 |
| | | | | 134/4 |

FOREIGN PATENT DOCUMENTS

| | | |
|---|---|---|
| KR | 10-2014-0065147 | 5/2014 |
| WO | 2009/126916 | 10/2009 |
| WO | 2009/143357 | 11/2009 |

OTHER PUBLICATIONS

Notice of Allowance dated Feb. 12, 2016, 2016 in U.S. Appl. No. 14/668,351.
Non-Final Office Action dated Aug. 11, 2016 in U.S. Appl. No. 15/082,726.
Notice of Allowance dated Jan. 31, 2017 in U.S. Appl. No. 15/082,726.
Non-Final Office Action dated Jul. 10, 2017 in U.S. Appl. No. 15/583,650.
Notice of Allowance dated Oct. 6, 2017 in U.S. Appl. No. 15/583,650.
Non-Final Office Action dated Feb. 23, 2018 in U.S. Appl. No. 15/859,702.
Notice of Allowance dated Jul. 23, 2018 in U.S. Appl. No. 15/859,702.

\* cited by examiner

METHOD OF MANUFACTURING SUBSTRATE OF ORGANIC LIGHT-EMITTING DISPLAY DEVICE

CROSS-REFERENCE TO RELATED APPLICATIONS

This application is a Continuation of U.S. patent application Ser. No. 15/859,702, filed on Jan. 1, 2018, issued as U.S. Pat. No. 10,147,881, which is a Continuation of U.S. patent application Ser. No. 15/583,650, filed on May 1, 2017, now issued as U.S. Pat. No. 9,893,284, which is a Continuation of U.S. patent application Ser. No. 15/082,726, filed on Mar. 28, 2016, now issued as U.S. Pat. No. 9,673,396, which is a Divisional of U.S. patent application Ser. No. 14/668,351, filed on Mar. 25, 2015, now issued as U.S. Pat. No. 9,577,195, which claims priority from and the benefit of Korean Patent Application No. 10-2014-0141764, filed on Oct. 20, 2014, each of which is hereby incorporated by reference for all purposes as if fully set forth herein.

BACKGROUND

Field

Exemplary embodiments relate to a method of manufacturing a substrate of an organic light-emitting display device.

Discussion of the Background

An organic light-emitting display device includes an anode electrode, a cathode electrode, and organic layers disposed between the anode electrode and the cathode electrode. The organic layers may include a hole injection layer (HIL), a hole transport layer (HTL), an electron transport layer (ETL), an electron injection layer (EIL), and an emission layer (EML). The organic electroluminescence (EL) device may be classified as a high molecular organic EL device or a low molecular organic EL device according to the type of material that form the organic layers, and particularly, the EML.

In case of a low-molecular organic light-emitting display device, the organic layers may be patterned via a method using a fine metal mask (FMM). In case of a high-molecular organic light-emitting display device, the organic layers may be patterned via an inkjet printing method or a laser induced thermal imaging (LITI) method. The patterning of a high molecular organic layer via the LITI method may require a light source, a target substrate on which an organic EL device is to be formed, and a donor film. The donor film typically includes a base substrate and a transfer layer including, for instance, a photothermal conversion layer and an organic film. The organic film may be formed on an entire surface of the photothermal conversion layer. According to the LITI method, the organic film can be transferred onto the target substrate by selectively applying laser light to a particular region on the donor film to enable the photothermal conversion layer to generate heat in the particular region.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of manufacturing a substrate of an organic light-emitting display device with improved processability.

Additional aspects will be set forth in the detailed description which follows, and, in part, will be apparent from the disclosure, or may be learned by practice of the inventive concept.

According to one or more exemplary embodiments, a method of manufacturing a substrate of an organic light-emitting display device, the method including: forming, on a first surface of a transparent substrate, a photothermal conversion layer configured to covert incident light into thermal energy; forming partition walls on the first surface in a first region of the photothermal conversion layer, the partition walls including a photosensitive compound including a resorcinarene, the resorcinarene including a perfluorocarbon group; forming an organic material layer on the first surface in a second region of the photothermal conversion layer, the second region being defined by the partition walls; removing the partition walls; placing a target substrate over the organic material layer; and applying light to a second surface of the transparent substrate, the second surface being opposite the first surface of the transparent substrate.

According to one or more exemplary embodiments, a method of manufacturing a substrate of an organic light-emitting display device, the method including: forming, on a first surface of a transport substrate, a photothermal conversion layer configured to covert incident light into thermal energy; forming a fluorine-based resin layer on the photothermal conversion layer, the fluorine-based resin layer including a fluorine-based resin; forming first partition walls on the first surface in a first region of the photothermal conversion layer, the first partition walls including a photosensitive polymer compound; forming second partition walls using the first partition walls as a mask, the second partition walls including the fluorine-based resin; forming an organic material layer on the first surface of a second region of the photothermal conversion layer, the second region being defined by the first partition walls and the second partition walls; removing the first partition walls and the second partition walls; placing a target substrate over the organic material layer; and applying light to a second surface of the transparent substrate, the second surface being opposite the first surface of the transparent substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the invention and are incorporated in and constitute a part of this specification, illustrate embodiments of the inventive concept, and together with the description serve to explain the principles of the inventive concept.

DETAILED DESCRIPTION OF THE ILLUSTRATED EMBODIMENTS

Figure 1:
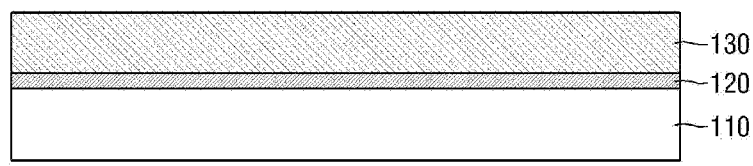
FIGS. 1, 2, 3, and 4 are cross-sectional views illustrating processes of manufacturing a transfer substrate, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1, 2, 3, and 4 are cross-sectional views illustrating processes S1, S2, S3, and S4, respectively, of manufacturing a transfer substrate, according to one or more exemplary embodiments.

Referring to FIG. 1, a photothermal conversion layer 120 is formed on an entire first surface of a transparent substrate 110, and a photosensitive compound layer 130, which includes a resorcinarene containing a perfluorocarbon group, is formed on an entire first surface of the photothermal conversion layer 120.

The transparent substrate 110 may be transparent (or at least translucent) to transmit light emitted from a light source (not illustrated) therethrough. For example, the transparent substrate may be at least one of, but is not limited to, a glass substrate, a quartz substrate, and a synthetic resin substrate formed of a transparent polymer material with high optical transmissivity, such as polyester, polyacryl, polyepoxy, polyethylene, polystyrene, and/or polyethylene terephthalate.

Figure 5:
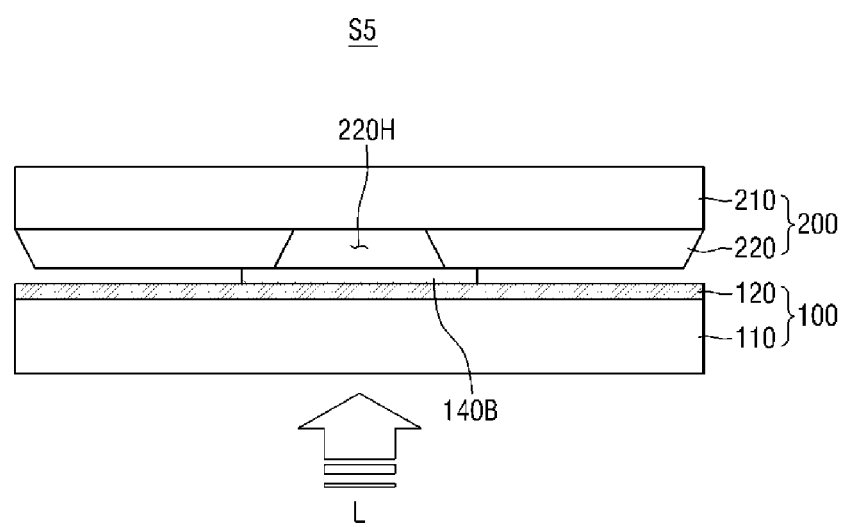
FIGS. 5 and 6 are cross-sectional views of a substrate of an organic light-emitting display device at various stages of manufacture, according to one or more exemplary embodiments.

The light source may be at least one of a flash lamp, a tungsten halogen lamp and a laser beam. The light source is disposed below a second surface of the transparent substrate 110, as illustrated in FIG. 5 as light source L. A laser beam may be applied to scan the entire second surface of the transparent substrate 110, or may be selectively applied to an organic material layer formed in a particular region.

The photothermal conversion layer 120 is formed on the entire first surface of the transparent substrate 110. The photothermal conversion layer 120 may absorb light within an infrared-visible light range of the light transmitted thereto through the transparent substrate 110, and may convert the absorbed light into thermal energy. For example, the photothermal conversion layer 120 may be formed of at least one of a metal material with relatively high light absorptivity, such as molybdenum (Mo), chromium (Cr), titanium (Ti), tin (Sn), tungsten (W), and an alloy thereof, or any other suitable material.

The photothermal conversion layer 120 may be formed by various methods, for example, but not limited to, sputtering, electron beam deposition and vacuum deposition. The photosensitive compound layer 130, which includes a resorcinarene containing a perfluorocarbon group, may be formed on the entire first surface of the photothermal conversion layer 120. The resorcinarene containing a perfluorocarbon group may be material immiscible with an organic material. For example, the resorcinarene containing a perfluorocarbon group may include, but is not limited to, a resorcinarene of Formula (1) and a resorcinarene of Formula (2), wherein $R^1$ is

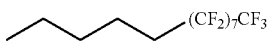

and $R^2$ is a tert-butoxycarbonyl (t-butoxycarbonyl) group:

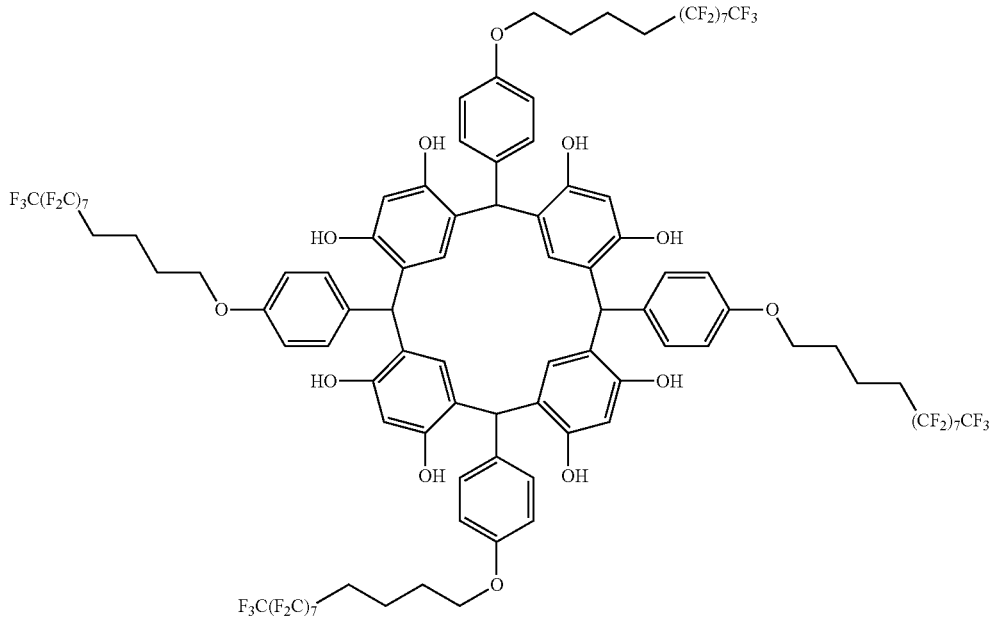

Formula (1)

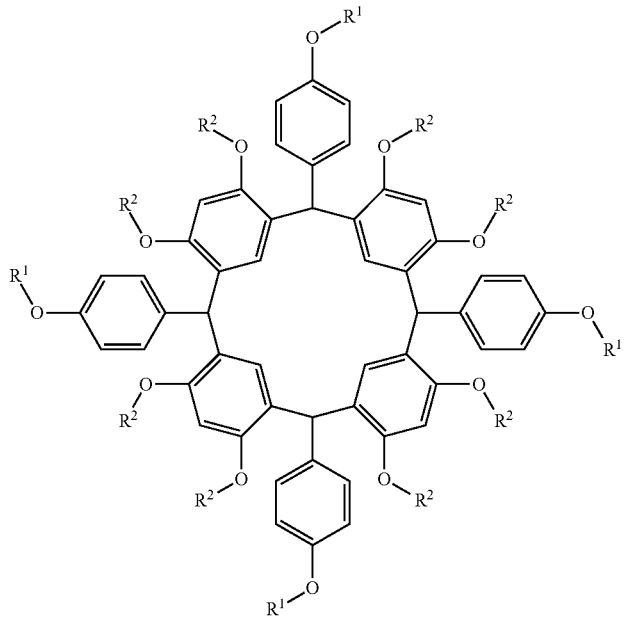

Formula (2)

The photosensitive compound layer 130, which includes the resorcinarene containing a perfluorocarbon group, may include at least one of the resorcinarene of Formula (1), the resorcinarene of Formula (2), and a mixture thereof.

The photosensitive compound layer 130, which includes the resorcinarene containing a perfluorocarbon group, may also include a photo-acid generator. For example, the photo-acid generator may be, but is not limited to, N-nonafluorobutane-sulfonyloxy-1,8-naphthalimide, N-nonafluoropropane-sulfonyloxy-1,8-naphthalimide, N-nonafluoroethane-sulfonyloxy-1,8-naphthalimide, N-nonafluoromethane-sulfonyloxy-1,8-naphthalimide, triphenylsulfonium perfluorooctanesulfonate, triphenylsulfonium perfluorobutanesulfonate, triphenylsulfonium trifluoromethanesulfonate, triphenylsulfonium hexafluorophosphate, triphenylsulfonium hexafluoroantimonate, diphenyliodonium perfluorooctanesulfonate, diphenyliodonium perfluorobutanesulfonate, diphenyliodonium trifluoromethanesulfonate, diphenyliodonium hexafluorophosphate, diphenyliodonium hexafluoroantimonate, n-hydroxynaphthalimide perfluorobutanesulfonate, n-hydroxynaphthalimide trifluoromethanesulfonate and/or a mixture thereof.

Figure 2:
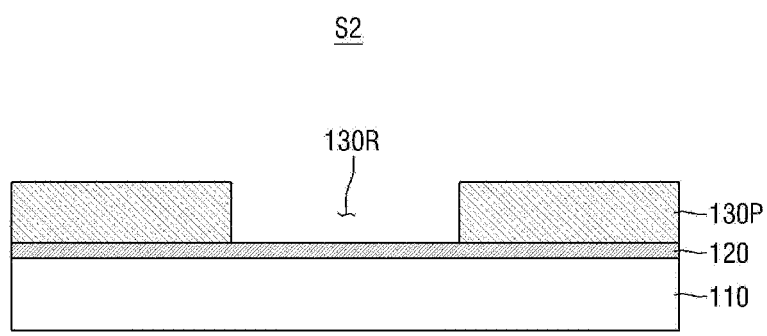

FIG. 2 illustrates a process of performing photolithography on the photosensitive compound layer 130, which includes the resorcinarene containing a perfluorocarbon group.

Figure 3:
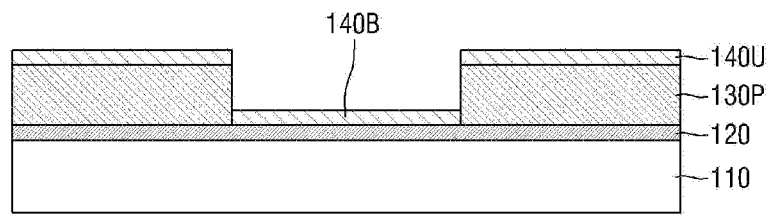

The process of performing photolithography on the photosensitive compound layer 130, which includes the resorcinarene containing a perfluorocarbon group, removes part of the photosensitive compound layer 130 overlapping a second region of the photothermal conversion layer 120 while leaving the remaining part of the photosensitive compound layer 130 overlapping a first region of the photothermal conversion layer 120. The first region is a region where an organic material layer 140B, which will be described in FIG. 3, is not formed, and the second region is a region where the organic material layer 140B is formed. The second region corresponds to a pixel region of a target substrate to be transferred (i.e., the substrate of an organic light-emitting display device), which is defined by a pixel-defining layer.

Portions of the photosensitive compound layer 130 remaining in the first region of the photothermal conversion layer 120 may serve as partition walls for defining the second region of the photothermal conversion layer 120. The portions of the photosensitive compound layer 130 remaining in the first region of the photothermal conversion layer 120 will hereinafter be referred to as first partition wall patterns 130P, and a region between the first partition wall patterns 130P will hereinafter be referred to as a first incision pattern 130R. The second region of the photothermal conversion layer 120 is exposed through the first incision pattern 130R.

The first partition wall patterns 130P may be formed by placing a mask (not illustrated) over the photosensitive compound layer 130 to protect the part of the photosensitive compound layer 130 overlapping the first region of the photothermal conversion layer 120, and selectively exposing it to light and developing the part of the photosensitive compound layer 130 overlapping the second region of the photothermal conversion layer 120 to remove the photosensitive compound layer 130 from the second region of the photothermal conversion layer 120. The first incision pattern 130R is formed where the photosensitive compound layer 130 is removed, and corresponds to the second region of the photothermal conversion layer 120.

FIG. 3 illustrates a process of forming an organic material layer 140U on the first partition wall patterns 130P and the organic material layer 140B on the surface of the second region of the photothermal conversion layer 120, which is exposed through the first incision pattern 130R.

The organic material layers 140U and 140B may include organic materials for forming organic layers of an organic light-emitting display device. More specifically, the organic material layers 140U and 140B may include an organic material for forming an emission layer (EML), an organic material for forming a hole injection layer (HIL), an organic material for forming a hole transport layer (HTL), an organic material for forming an electron injection layer (EIL), and an organic material for forming an electron transport layer (ETL).

The first partition wall patterns 130P may include a fluorine-based material that is immiscible with an organic material, and, as such, the first partition wall patterns 130P may not deteriorate the physical properties of the organic material layers 140U and 140B.

Conventionally, however, a photosensitive resin composition often causes a reaction with an organic material, and, thus, may cause the deterioration of the physical properties of an organic material layer. As a result, it is not easy to directly pattern an organic material layer when using a photosensitive resin composition. On the other hand, in the method of manufacturing a transfer substrate according to the exemplary embodiments, an organic material layer may be directly patterned using a fluorine-based material that is immiscible with an organic material without deteriorating the physical properties of the organic material layer.

Figure 4:
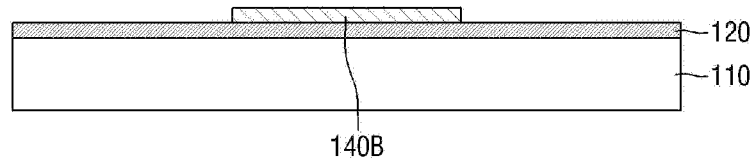

FIG. 4 illustrates a process of removing the first partition wall patterns 130P by using a lift-off method.

The first partition wall patterns 130P may be lifted off using a fluorine-based solvent. The fluorine-based solvent may be, but is not limited to, hydrofluoroether (HFE). Since the fluorine-based solvent does not affect the organic material layer 140B, the fluorine-based solvent, unlike a typical organic solvent, does not deteriorate the physical properties of the organic material layer 140B. Examples of the HFE may include, but are not limited to, methyl nonafluorobutyl ether, methyl nonafluoroisobutyl ether, an isomeric mixture of methyl nonafluorobutyl ether and methyl nonafluoroisobutyl ether, ethyl nonafluorobutyl ether, ethyl nonafluoroisobutyl ether, an isomeric mixture of ethyl nonafluorobutyl ether and ethyl nonafluoroisobutyl ether, 3-ethoxy-1,1,1,2,3,4,4,5,5,6,6,6,-dodecafluoro-2-trifluoromethyl-hexane, 1,1,1,2,2,3,4,5,5,5-decafluoro-3-methoxy-4-trifluoromethyl-pentane, and/or a mixture thereof.

Since the first partition wall patterns 130P may be removed using the fluorine-based solvent, the organic material layer 140B may be formed only in the second region of the photothermal conversion layer 120.

According to one or more exemplary embodiments, a transfer substrate 100 can be formed to have a simple structure in which the transparent substrate 110 and the photothermal conversion layer 120 are stacked. As such, the structure may be free of reflective layer patterns, and, as a result, the time, effort, and cost of manufacturing a transfer substrate may be reduced.

Figure 6:
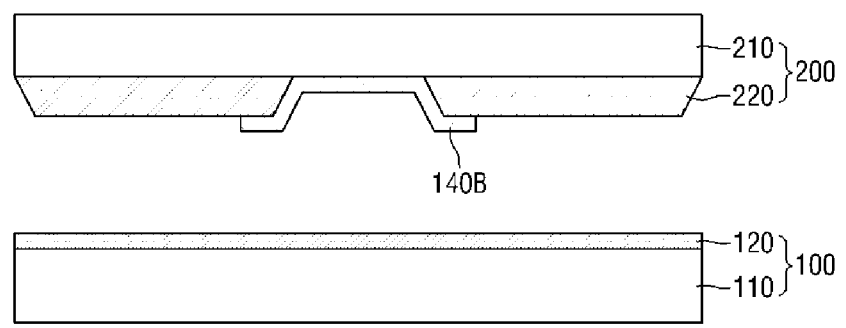

FIGS. 5 and 6 are cross-sectional views of a substrate of an organic light-emitting display at various stages of manufacture, according to one or more exemplary embodiments.

FIG. 5 illustrates a process of applying light L to the transfer substrate 100 of FIG. 4 from below the transfer substrate 100 after placing the transfer substrate the transfer substrate 100 to face the target substrate 200.

Referring to FIG. 5, the target substrate 200 may include a transparent substrate 210 and a pixel-defining layer 220, which is formed on a bottom surface of the transparent substrate 210. The target substrate 200 is a target substrate to which the organic material layer 140B on the transfer substrate 100 is to be transferred. A region between parts of the pixel-defining layer 220 is a pixel region 220H.

More specifically, the transfer substrate 100 is aligned with the target substrate 200 such that the second region of the photothermal conversion layer 120 can correspond to the pixel region 220H of the target substrate 200. Thereafter, the light L is applied to the transfer substrate 100 from below the transfer substrate 100.

The light L, which is applied to the transfer substrate 100 from below the transfer substrate 100, is incident upon the photothermal conversion layer 120 through the transparent substrate 110, and the photothermal conversion layer 120 converts the light incident thereupon into heat. The heat generated by the photothermal conversion layer 120 is transmitted to the organic material layer 140B.

FIG. 6 illustrates a process of transferring the organic material layer 140B onto the pixel region 220H of the target substrate 200.

Referring to FIG. 6, the organic material layer 140B is evaporated by the heat generated by the photothermal conversion layer 120 and is thus transferred onto a target substrate to be transferred, i.e., the target substrate 200. The organic material layer 140B is transferred to completely cover the pixel region 220H of the target substrate 200. The organic material layer 140B may also be transferred onto the pixel-defining layer 220.

The transfer substrate 100 from which the organic material layer 140B is transferred onto the target substrate 200 has a structure in which the photothermal conversion layer 120 is formed on one surface of the transparent substrate 110, and can be reused regardless of the type of organic material used or the size of a pixel region of a substrate of an organic light-emitting display device.

FIGS. 7, 8, 9, 10, and 11 are cross-sectional views of a transfer substrate at various stages of manufacture, according to one of more exemplary embodiments.

Figure 7:
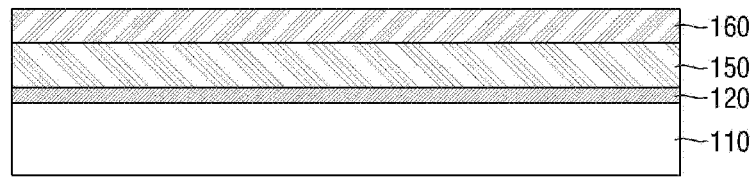
FIGS. 7, 8, 9, 10, and 11 are cross-sectional views of a transfer substrate at various stages of manufacture, according to one or more exemplary embodiments.

The process S11 of FIG. 7 is identical to the process S1 of FIG. 1 in that a photothermal conversion layer 120 is formed on an entire first surface of a transparent substrate 110. However, the process S11 of FIG. 7 differs from the process S1 of FIG. 1 in that a fluorine-based resin layer 150 is formed on an entire first surface of the photothermal conversion layer 120 and a photosensitive resin composition layer 160 is formed on an entire first surface of the fluorine-based resin layer 150.

The fluorine-based resin layer 150 is formed of a fluorine-based resin. For example, the fluorine-based resin may be, but not limited to, polytetrafluoroethylene (PTFE), poly (perfluoroalkyl acrylate) (PFA), polychlorotrifluoroethylene (PCTFE), fluorinated ethylenepropylene resin (FEP), polychloro-trifluoroethylene (PCFE), polyvinylidenefluoroide (PVDF), and/or a copolymer thereof.

The photosensitive resin composition layer 160 may be formed of a photosensitive resin composition. For example, the photosensitive resin composition may encompass any kind of photosensitive resin compositions that may be commonly use in photolithography.

Figure 8:
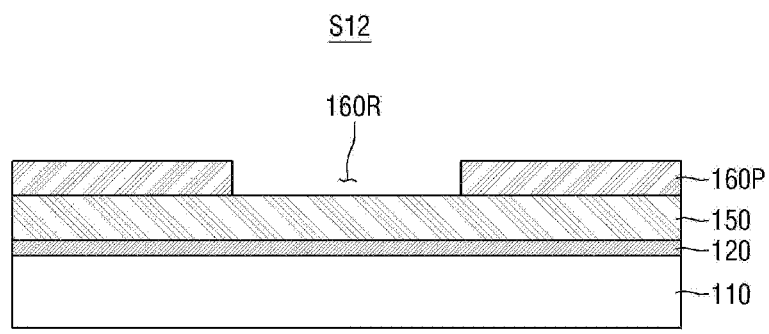

FIG. 8 illustrates a process of performing photolithography on the photosensitive resin composition layer 160. Referring to FIG. 8, photosensitive resin composition layer 160 patterns may be formed by placing a mask (not illustrated) over the photosensitive resin composition layer 160 to protect part of the photosensitive resin composition layer 160 overlapping a first region of the photothermal conversion layer 120, and selectively exposing to light and developing the remaining part of the photosensitive resin composition layer 160 overlapping a second region of the photothermal conversion layer 120.

The photosensitive resin composition layer patterns may include second partition wall patterns 160P and a second incision pattern 160R, and the second incision pattern 160R may be disposed between the second partition wall patterns 160P.

The process S12 of FIG. 8 differs from the process S2 of FIG. 2 in that photosensitive resin composition layer patterns, instead of photosensitive compound layer patterns containing a resorcinarene containing a perfluorocarbon group, are formed by photolithography.

Figure 9:
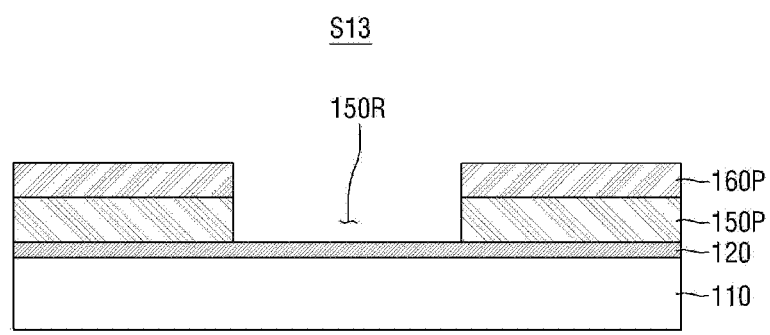

FIG. 9 illustrates a process of performing photolithography on the fluorine-based resin layer 150. Referring to FIG. 9, the fluorine-based resin layer 150 may be patterned by using the second partition wall patterns 160P as a mask, thereby obtaining fluorine-based resin layer patterns. The fluorine-based resin layer patterns may include third partition wall patterns 150P and a third incision pattern 150R, and the third incision pattern 150R may be disposed between the third partition wall patterns 150P.

The process S13 of FIG. 9 differs from the process S2 of FIG. 2 in that the surface of the second region of the photothermal conversion layer 120 is exposed through both the second incision pattern 160R and the third incision pattern 150R, instead of through the first incision pattern 130R only.

Figure 10:
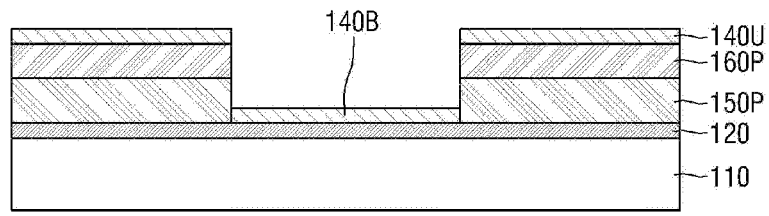

The process S14 of FIG. 10 is identical to the process S3 of FIG. 3 in that the organic material layer 140B is formed on the entire first surface of the photothermal conversion layer 120. However, the process S14 of FIG. 10 differs from the process S3 of FIG. 3 in that an organic material layer 140U is formed on the second partition wall patterns 160P.

Figure 11:
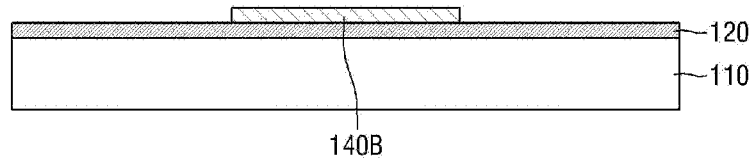

The process S15 of FIG. 11 differs from the process S4 of FIG. 4 in that the transfer substrate 100 is formed by lifting off both the second partition wall patterns 160P and the third partition wall patterns 150P, instead of lifting off only the first partition wall patterns 130P, with the use of a fluorine-based solvent.

FIGS. 12, 13, 14, and 15 are cross-sectional views of a transfer substrate at various stages of manufacture, according to one or more exemplary embodiments.

Figure 12:
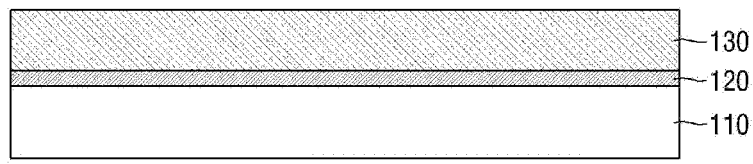
FIGS. 12, 13, 14, and 15 are cross-sectional views of a transfer substrate at various stages of manufacture, according to one or more exemplary embodiments.

The process S'1 of FIG. 12 is identical to the process S1 of FIG. 1 in that a photothermal conversion layer 120 is formed on an entire first surface of a transparent substrate 110 and a photosensitive compound layer 130, which includes a resorcinarene containing a perfluorocarbon group, is formed on an entire first surface of the photothermal conversion layer 120.

Figure 13:
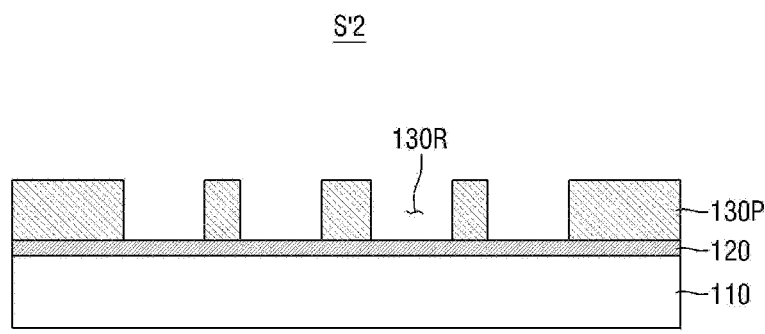
Figure 14:
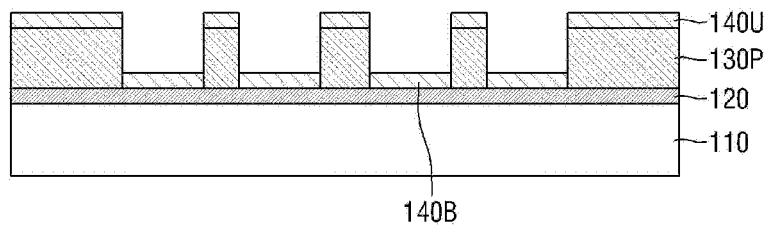

The processes S'2 and S'3 of FIGS. 13 and 14 differ from the process S2 of FIG. 2 in that first partition wall patterns 130P are formed overlapping the surface of a third region of the photothermal conversion layer 120, which is provided inside a second region of the photothermal conversion layer 120, whereas in the process S2 of FIG. 2, only the incision pattern 130R is formed in the second region of the photothermal conversion layer 120.

First incision patterns 130R, which are isolated from each other, are arranged between the first partition wall patterns 130P formed in the second region of the photothermal conversion layer 120, and an organic material layer 140B is formed on parts of the photothermal conversion layer 120 exposed between the first incision patterns 130R.

Figure 15:
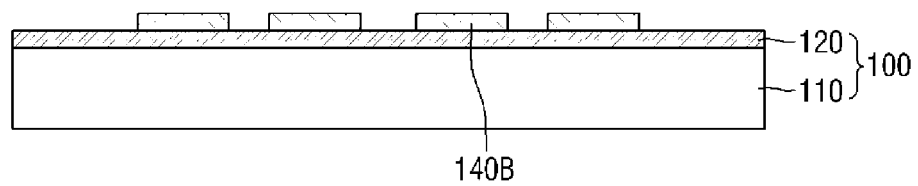

The process S'4 of FIG. 15 is identical to the process S4 of FIG. 4 in that the first partition wall patterns 130P are lifted off by using a fluorine-based solvent. However, the process S'4 of FIG. 15 differs from the process S4 of FIG. 4 in that a plurality of organic material layers 140B are formed in the second region of the photothermal conversion layer isolated from one another, whereas in the process S4 of FIG. 4, a single continuous organic material layer 140B is formed.

Figure 16:
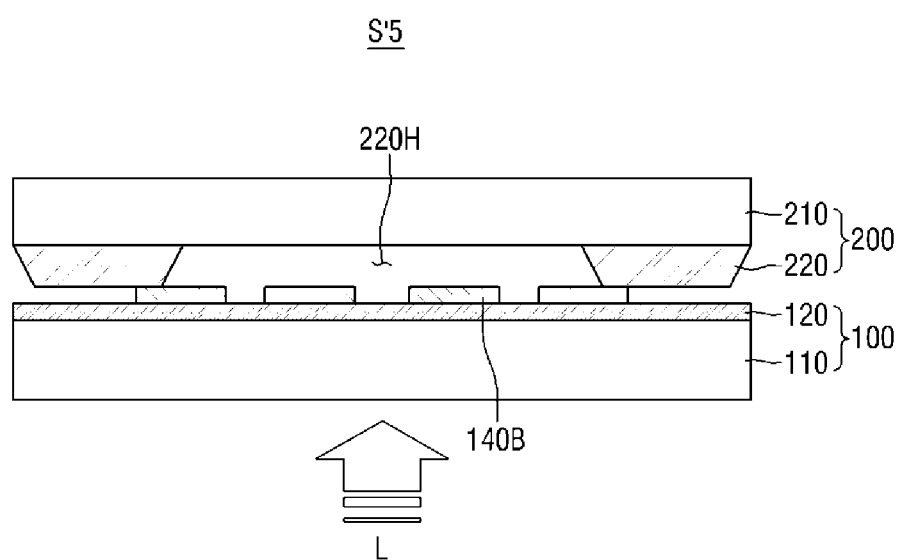
FIGS. 16 and 17 are cross-sectional views of a substrate of an organic light-emitting display device at various stages of manufacture, according to one or more exemplary embodiments.
Figure 17:
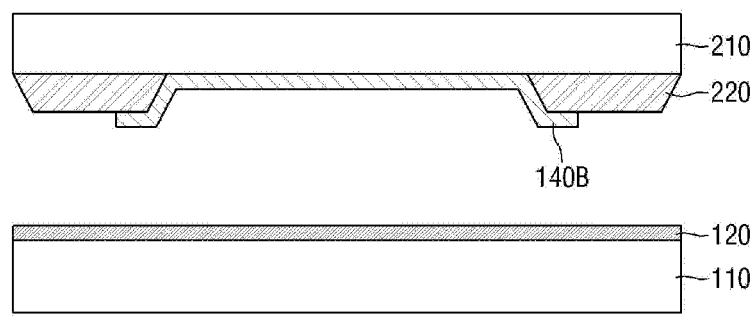
Figure 18:
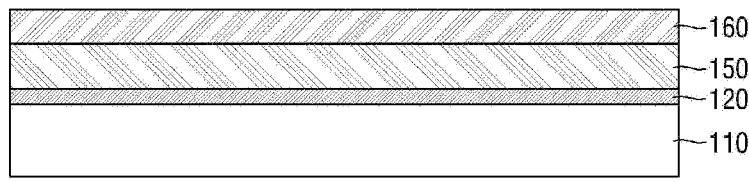
FIGS. 18, 19, 20, 21, and 22 are cross-sectional views of a transfer substrate at various stages of manufacture, according to one or more exemplary embodiments.
Figure 19:
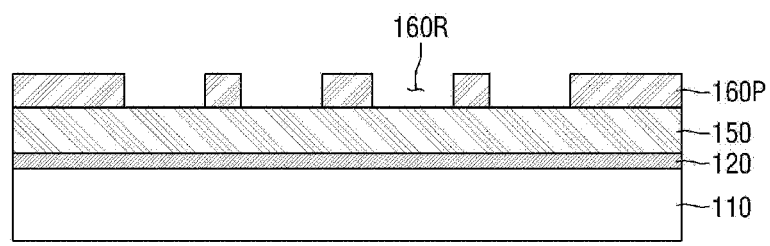
Figure 20:
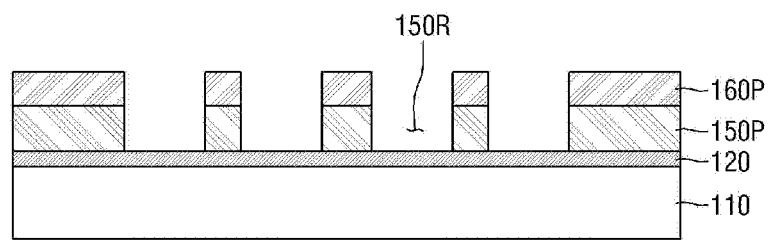
Figure 21:
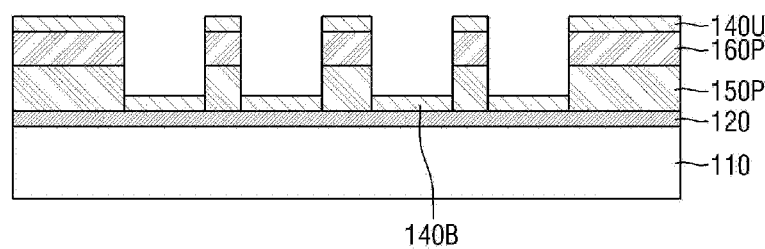
Figure 22:
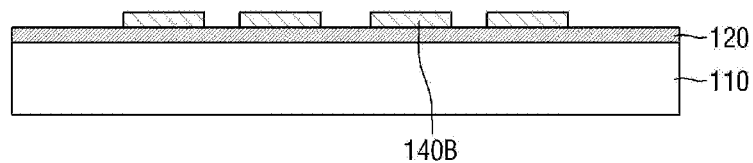

FIGS. 16 and 17 are cross-sectional views of a substrate of an organic light-emitting display device at various stages of manufacture, according to one or more exemplary embodiments.

The process S'S of FIG. 16 is identical to the process S5 of FIG. 5 in that the transfer substrate 100 is aligned with a target substrate to be transferred, i.e., a target substrate 200 of an organic light-emitting display device, such that the second region of the photothermal conversion layer 120 can correspond to a pixel region 220H of the target substrate 200 and light L is applied to the transfer substrate 100 from below the transfer substrate 100.

Referring to FIG. 16, the organic material layers 140B are formed in the second region of the photothermal conversion layer 120 isolated from one another. Since the organic material layers 140B are isolated from another, the amount by which the organic material layers 140B is evaporated onto a target substrate may be adjusted. Accordingly, the pattern profile of an organic layer formed on the target substrate may have a surface with improved flatness.

FIG. 17 illustrates a process of evaporating the organic material layers 140B with the use of heat generated by the photothermal conversion layer 120 to deposit an organic material layer 140B in the pixel region 220H of the target substrate 200.

Referring to FIG. 17, the organic material layer 140B may cover the entire pixel region 220H of the target substrate 200. The organic material layers 140B of FIG. 16, which are isolated from one another, are evaporated and diffused into a single organic material layer 140B that covers the entire pixel region 220H, as illustrated in FIG. 17. The target substrate 200 of FIG. 17 differs from the target substrate 200 of FIG. 6 in that the organic material layer 140B may have a pattern profile with improved flatness, as mentioned above.

FIGS. 18, 19, 20, 21, and 22 are cross-sectional views of a transfer substrate at various stages of manufacture, according to one or more exemplary embodiments.

The processes S'11, S'12, S'13, S'14, and S'15 of FIGS. 18, 19, 20, 21, and 22 differ from the processes S'1, S'2, S'3, S'4, and S'5 of FIGS. 12, 13, 14, and 15 in that a plurality of second partition wall patterns 160P and a plurality of third partition wall patterns 150P are formed in a second region of a photothermal conversion layer 120, and a plurality of organic material layers 140B are formed to be isolated from one another.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of forming an organic material pattern film, the method comprising:
    forming partition walls on a first region of a first layer, the partition walls comprising a fluorine containing material;
    forming a second layer including an organic material on a second region of the first layer, the second region being defined by the partition walls; and
    removing the partition walls.

2. The method of claim 1, further comprising:
    forming the first layer on a substrate before the step of forming partition walls.

3. The method of claim 1, wherein the forming of the partition walls comprises:
    forming, on a first surface of the first layer, a third layer comprising a photosensitive compound;
    placing a mask over the third layer and selectively exposing part of the third layer in the second region to light while protecting the third layer in the first region with the mask; and
    developing and removing the third layer in the second region.

4. The method of claim 1, wherein the partition walls further comprises a photo-acid generator.

5. The method of claim 4, wherein the photo-acid generator comprises at least one selected from the group consisting of N-nonafluorobutane-sulfonyloxy-1,8-naphthalimide, N-nonafluoropropane-sulfonyloxy-1,8-naphthalimide, N-nonafluoroethane-sulfonyloxy-1,8-naphthalimide, N-nonafluoromethane-sulfonyloxy-1,8-naphthalimide, triphenylsulfonium perfluorooctanesulfonate, triphenylsulfonium perfluorobutanesulfonate, triphenylsulfonium trifluoromethanesulfonate, triphenylsulfonium hexafluorophosphate, triphenylsulfonium hexafluoroantimonate, diphenyliodonium perfluorooctanesulfonate, diphenyliodonium perfluorobutanesulfonate, diphenyliodonium trifluoromethanesulfonate, diphenyliodonium hexafluorophosphate, diphenyliodonium hexafluoroantimonate, n-hydroxynaphthalimide perfluorobutanesulfonate, and n-hydroxynaphthalimide trifluoromethanesulfonate.

6. The method of claim 1, wherein the partition walls are removed utilizing a lift-off method which removes the partition walls by using a solvent comprising a fluorine containing material.

7. The method of claim 6, wherein the fluorine-based solvent comprises at least one hydrofluoroether (HFE) selected from the group consisting of methyl nonafluorobutyl ether, methyl nonafluoroisobutyl ether, an isomeric mixture of methyl nonafluorobutyl ether and methyl nonafluoroisobutyl ether, ethyl nonafluorobutyl ether, ethyl nonafluoroisobutyl ether, an isomeric mixture of ethyl nonafluorobutyl ether and ethyl nonafluoroisobutyl ether, 3-ethoxy-1,1,1,2,3,4,4,5,5,6,6,6,-dodecafluoro-2-trifluoromethyl-hexane, and 1,1,1,2,2,3,4,5,5,5-decafluoro-3-methoxy-4-trifluoromethyl-pentane.

* * * * *